(12) United States Patent
Chen et al.

(10) Patent No.: US 9,184,360 B2
(45) Date of Patent: Nov. 10, 2015

(54) LIGHT-EMITTING DEVICE

(71) Applicant: Genesis Photonics Inc., Tainan (TW)

(72) Inventors: Cheng-Yen Chen, Tainan (TW); Yi-Fan Li, Tainan (TW); Han-Min Wu, Tainan (TW); Kuan-Chieh Huang, Tainan (TW); Tung-Lin Chuang, Tainan (TW); Sheng-Yuan Sun, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 14/715,581

(22) Filed: May 18, 2015

(65) Prior Publication Data

US 2015/0263257 A1    Sep. 17, 2015

Related U.S. Application Data

(63) Continuation of application No. 13/975,391, filed on Aug. 26, 2013, now Pat. No. 9,035,342.

(30) Foreign Application Priority Data

May 27, 2013    (TW) .............................. 102118649 A

(51) Int. Cl.
*H01L 33/00* (2010.01)
*H01L 33/64* (2010.01)
*H01L 33/60* (2010.01)
*H01L 33/50* (2010.01)
*H01L 33/48* (2010.01)

(52) U.S. Cl.
CPC ............ *H01L 33/642* (2013.01); *H01L 33/486* (2013.01); *H01L 33/505* (2013.01); *H01L 33/60* (2013.01); *H01L 33/641* (2013.01)

(58) Field of Classification Search
CPC ... H01L 33/642; H01L 33/507; H01L 33/644; H01L 33/58
USPC ......................................................... 257/98
See application file for complete search history.

(56) References Cited

U.S. PATENT DOCUMENTS

2009/0267093 A1* 10/2009 Kamada et al. ................ 257/98
2011/0084297 A1*  4/2011 Ogata et al. ..................... 257/98
2011/0090671 A1*  4/2011 Bertram et al. ................ 362/84

* cited by examiner

*Primary Examiner* — Trung Q Dang
(74) *Attorney, Agent, or Firm* — Jianq Chyun IP Office

(57) ABSTRACT

A light-emitting device of the invention includes a base, at least one light-emitting element, a wavelength transferring cover and a heat-conducting structure. The light-emitting element is disposed on the base and electrically connected to the base. The wavelength transferring cover is disposed on the base and covers the light-emitting element. The heat-conducting structure is disposed on the base and directly contacts the wavelength transferring cover.

31 Claims, 8 Drawing Sheets

US 9,184,360 B2

LIGHT-EMITTING DEVICE

CROSS-REFERENCE TO RELATED APPLICATION

This application is a continuation application of and claims the priority benefit of U.S. application Ser. No. 13/975,391, filed on Aug. 26, 2013, now allowed. The prior U.S. application Ser. No. 13/975,391 claims the priority benefit of Taiwan application serial no. 102118649, filed on May 27, 2013. The entirety of each of the above-mentioned patent applications is hereby incorporated by reference herein and made a part of this specification.

BACKGROUND OF THE INVENTION

1. Field of the Invention

The invention generally relates to a light-emitting device, and more particularly, to a light-emitting device with better heat-dissipating effect.

2. Description of Related Art

With the evolution of photoelectrical technology, the light-emitting mechanism of light-emitting elements is also evolved from the thermoluminescence to the electroluminescence (EL). In order to result in different light colors, the EL-based light-emitting element adopts phosphors to convert the wavelength of the light emitted from the light-emitting element and it has become a common approach.

In terms of light-emitting diode lamps (LED lamps), in order to achieve different light color, a wavelength conversion cover is normally disposed over an LED light source module. When the light emitted from the LED light source module irradiates the wavelength conversion cover, a white light conversion starts. However, both the thermal energy produced by the LED light source module and the thermal energy produced during white light conversion would be accumulated on the wavelength conversion cover to rise the temperature of the wavelength conversion cover. Since the wavelength conversion cover is made of phosphors and polymer material or glass, and the phosphors under a high temperature would produce phenomenon of thermal quenching of luminescence, the fluorescent conversion effect of the wavelength conversion cover is degraded to further produce color shift phenomenon.

SUMMARY OF THE INVENTION

Accordingly, the invention is directed to a light-emitting device, wherein the heat-conducting structure thereof directly contacts a wavelength transferring cover to quickly expel the heat produced by a light-emitting element of the light-emitting device so as to effectively reduce the thermal quenching phenomenon of luminescence.

A light-emitting device includes a base; a wavelength converting structure, comprising: a heat-conducting structure comprising a plurality of accommodating spaces; and a wavelength converting material filled in the accommodating spaces; and at least one light-emitting element disposed on the base, wherein the base is connected to the heat-conducting structure, and the wavelength converting structure covers the light-emitting element.

A light-emitting device includes a base having at least one light-emitting element mounted thereon; a heat-conducting meshed frame connected to the base; and a plurality of wavelength converting blocks embedded in meshes of the heat-conducting meshed frame, the wavelength converting blocks and the heat-conducting meshed frame covering the light-emitting element.

A light-emitting device includes a base having at least one light-emitting element mounted thereon; a wavelength converting layer; and a light-transmissive and heat-conducting body connected to the base, wherein the wavelength converting layer is carried and covered by the heat-conducting body, and the wavelength converting layer and the heat-conducting body cover the light-emitting element.

A light-emitting device includes a light emitting base; a wavelength converting material covering the light emitting base; and a reflective and heat-conducting body connecting the light emitting base and the wavelength converting material, and the reflective and heat-conducting body being light-transmissive.

Based on the description above, since the heat-conducting structure of the invention is disposed on the base and directly contacts the wavelength transferring cover, the heat-conducting structure can quickly expel the heat produced by a light-emitting element via the base and avoid the heat produced by the light-emitting element from concentrating on the wavelength transferring cover so as to effectively reduce the thermal quenching phenomenon of luminescence of the wavelength transferring cover. In short, the light-emitting device of the invention has better heat-dissipating effect and can effectively avoid producing the thermal quenching phenomenon of luminescence.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF THE EMBODIMENTS

Figure 1A:
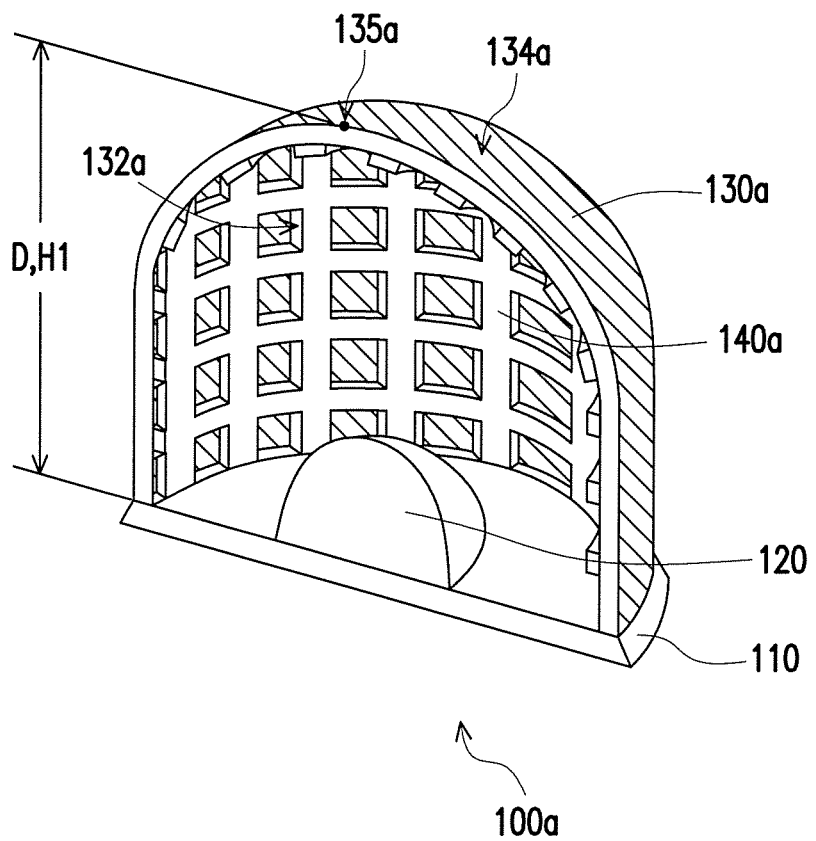
FIG. 1A is a partial three-dimensional cross-sectional view of a light-emitting device according to an embodiment of the invention.

FIG. 1A is a partial three-dimensional cross-sectional view of a light-emitting device according to an embodiment of the invention. Referring to FIG. 1A, in the embodiment, a light-emitting device 100a includes a base 110, at least one light-emitting element 120 (only one is shown in FIG. 1A), a wavelength transferring cover 130a and a heat-conducting structure 140a. In more details, the light-emitting element 120 is disposed on the base 110 and electrically connected to the base 110. The wavelength transferring cover 130a is disposed on the base 110 and covers the light-emitting element 120. The heat-conducting structure 140a is disposed on the base 110 and directly contacts the wavelength transferring cover 130a.

Specifically, the light-emitting element 120 in the embodiment is, for example, a light-emitting diode (LED) for producing light. The wavelength transferring cover 130a has an inner surface 132a and an outer surface 134a opposite to each other, in which the heat-conducting structure 140a directly contacts the inner surface 132a of the wavelength transferring cover 130a. As shown by FIG. 1A, the heat-conducting structure 140a in the embodiment is, for example, a mesh heat-conducting structure, in which the mesh pattern of the mesh heat-conducting structure is, for example, rectangular shape, which the invention is not limited to. Perfectly, the heat-conducting structure 140a in the embodiment preferably occupies 5-40% of the surface area of the inner surface 132a of the wavelength transferring cover 130a. If the ratio is less than 5%, the heat-conducting effect would not be good, while if the ratio is greater than 40%, it may cause light-shading to affect the light emitting efficiency. In particular, the ratio of the maximal vertical distance D between a top point 135a on the wavelength transferring cover 130a and the base 110 over the height H1 of the heat-conducting structure 140a ranges between 0.9 to 2. The height H1 of the heat-conducting structure 140a should be specified according to the real demand to get better heat-conducting effect without affecting light emitting. The material of the heat-conducting structure 140a is selected from materials with high heat-conducting effect and high reflectivity, such as at least one of silver, gold, copper, platinum, tin and aluminium, or selected from materials with better thermal conductivity such as carbon nanotube or grapheme. In this way, in addition to quickly expelling the heat produced by the light-emitting element 120 via the base 110 to avoid the heat from concentrating or staying on the wavelength transferring cover 130a, the heat-conducting structure 140a can increase the light emitting effect of the light-emitting element 120 through the structure design and the material selection, which further advances the light emitting efficiency of the light-emitting device 100a.

Figure 1B:
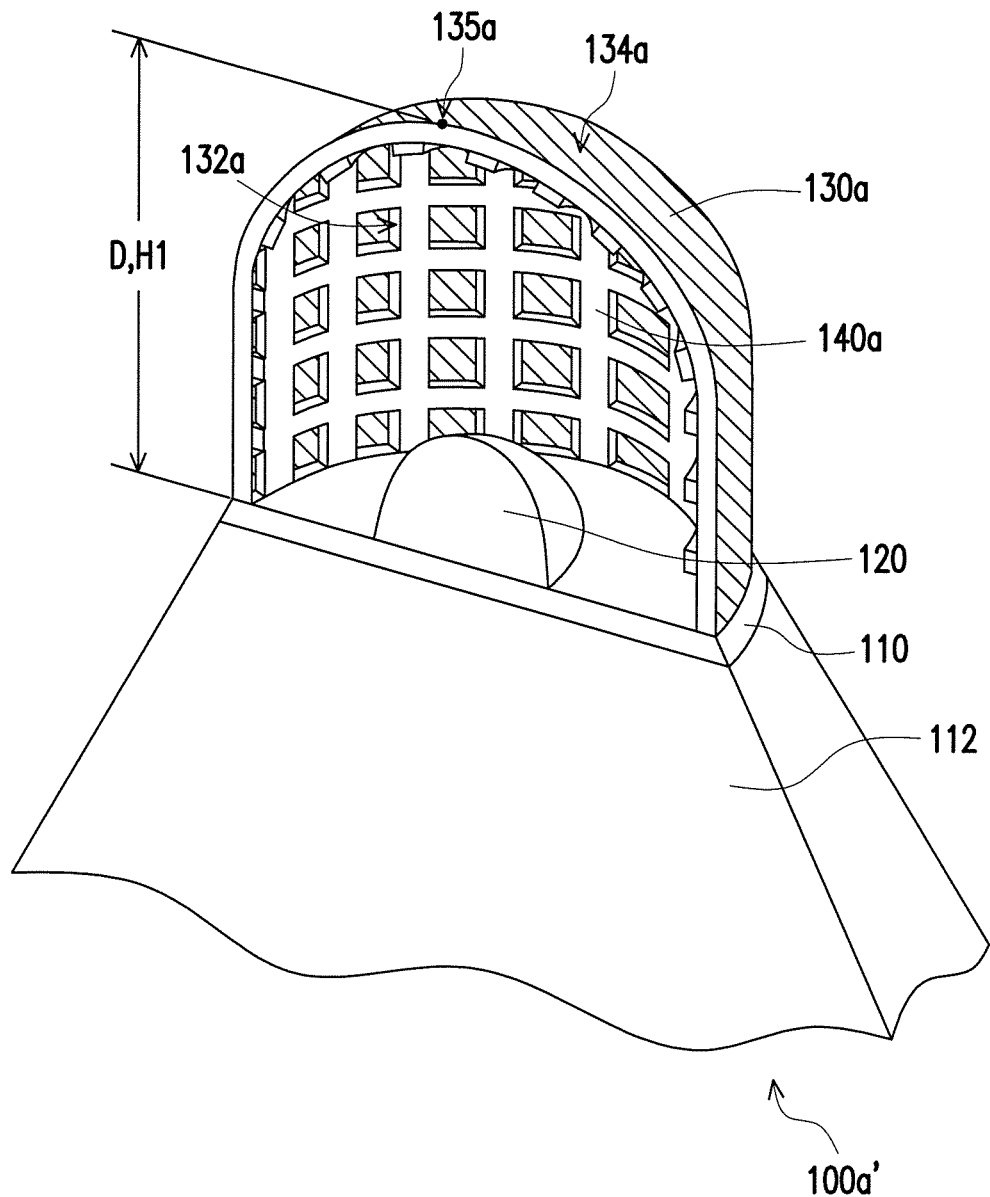
FIG. 1B is a partial three-dimensional cross-sectional view of a light-emitting device according to another embodiment of the invention.

FIG. 1B is a partial three-dimensional cross-sectional view of a light-emitting device according to another embodiment of the invention. Referring to FIG. 1B, the light-emitting device 100a' in the embodiment is similar to the light-emitting device 100a of FIG. 1A except that the light-emitting device 100a' in the embodiment further includes a heat-dissipating base 112, in which the base 110 is disposed on the heat-dissipating base 112. By means of layout of the heat-dissipating base 112 and the heat-conducting structure 140a, the heat-conducting structure 140a is able to quickly expel the heat produced by the light-emitting element 120 outwards or to the other external heat-conducting parts such as cooling fins (not shown) via the heat-dissipating base 112. The material of the heat-dissipating base 112 is, preferably, selected from at least one of aluminium, tin, copper, silver, gold and ceramic, which can effectively increase the heat-dissipating efficiency of the light-emitting device 100a'. In particular, since the heat-dissipating base 112 has a height so that the light-emitting element 120 disposed on the base 110 can be elevated so as to expand the light emitting angle (i.e., the full circumferential angle).

It should be noted that the embodiment does not limit the relative disposition between the heat-conducting structure 140a and the wavelength transferring cover 130a. In other embodiments, referring to FIG. 2, a wavelength transferring cover 130a' in the embodiment is composed of, for example, an arc top-cover 131a and a side-wall 133a, in which the side-wall 133a is connected between the arc top-cover 131a and the base 110, and the side-wall 133a is upright at the base 110 and surrounds the light-emitting element 120. The heat-conducting structure 140b of the light-emitting device 100b is, for example, a mesh heat-conducting structure, which is, for example, a mesh heat-conducting structure with a rectangular mesh pattern and the mesh heat-conducting structure is disposed on the inner surface 132a of the wavelength transferring cover 130a' and located on the side-wall 133a only. In other words, the height H2 of the heat-conducting structure 140b is less than the maximal vertical distance D between the top point 135a of the wavelength transferring cover 130a' and the base 110. The ratio of the maximal vertical distance D and the height H2 herein is, preferably, 2, i.e., the height of the heat-conducting structure 140b is a half of the maximal vertical distance D between the top point 135a of the wavelength transferring cover 130a' and the base 110 only so that the heat-conducting effect and the design avoiding light-shading reaches the optimum balance.

Figure 2:
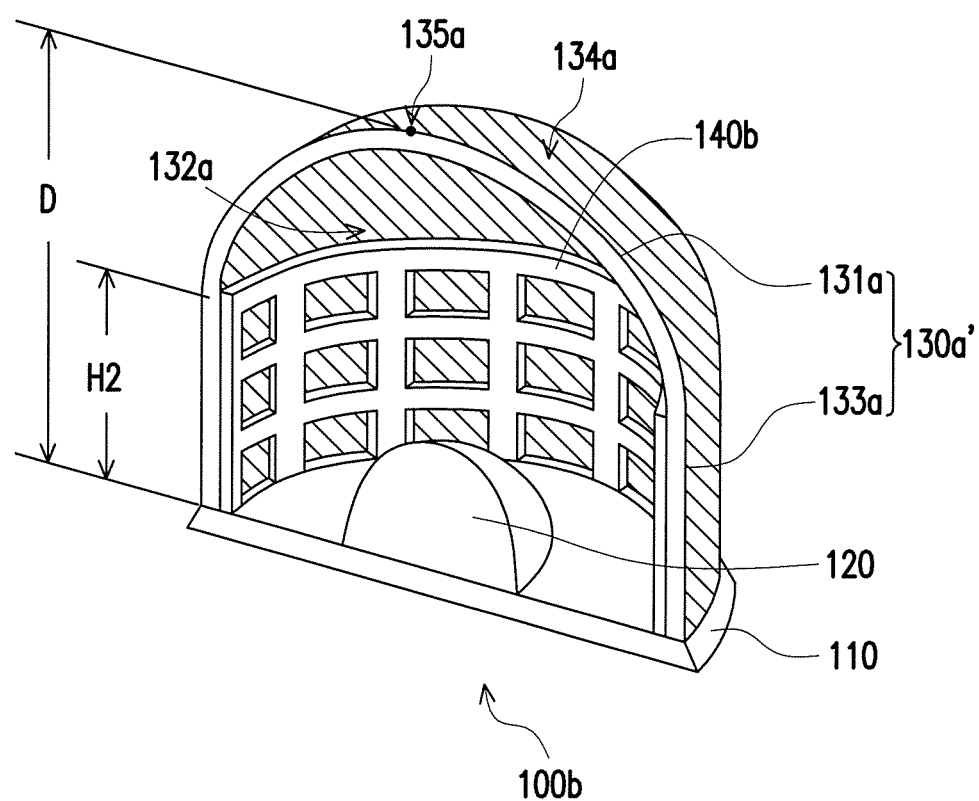
FIG. 2 is a partial three-dimensional cross-sectional view of a light-emitting device according to yet another embodiment of the invention.
Figure 3A:
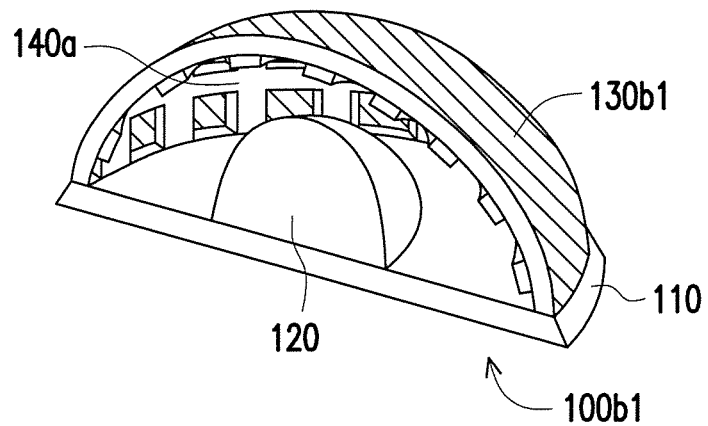
FIG. 3A is a partial three-dimensional cross-sectional view of a light-emitting device according to yet another embodiment of the invention.
Figure 3B:
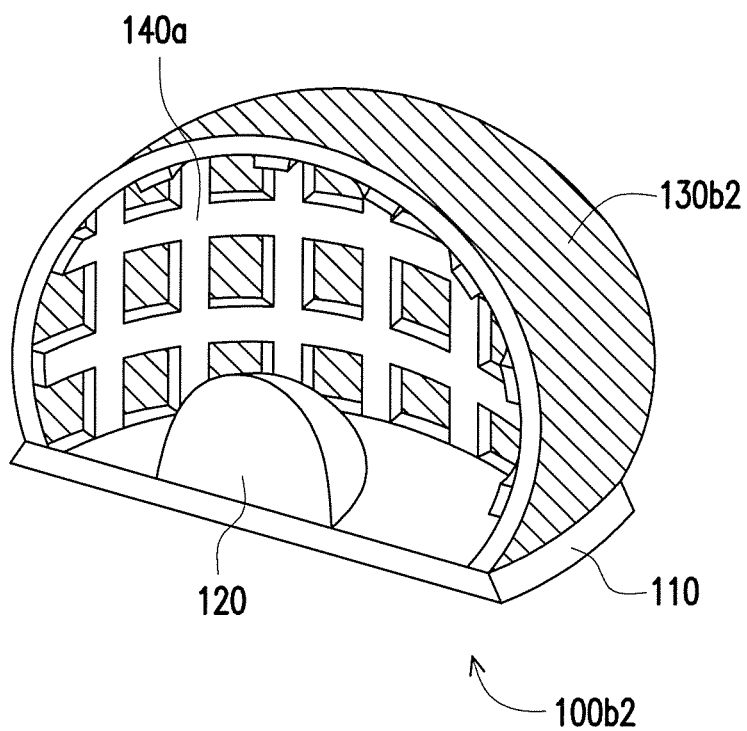
FIG. 3B is a partial three-dimensional cross-sectional view of a light-emitting device according to yet another embodiment of the invention.
Figure 3C:
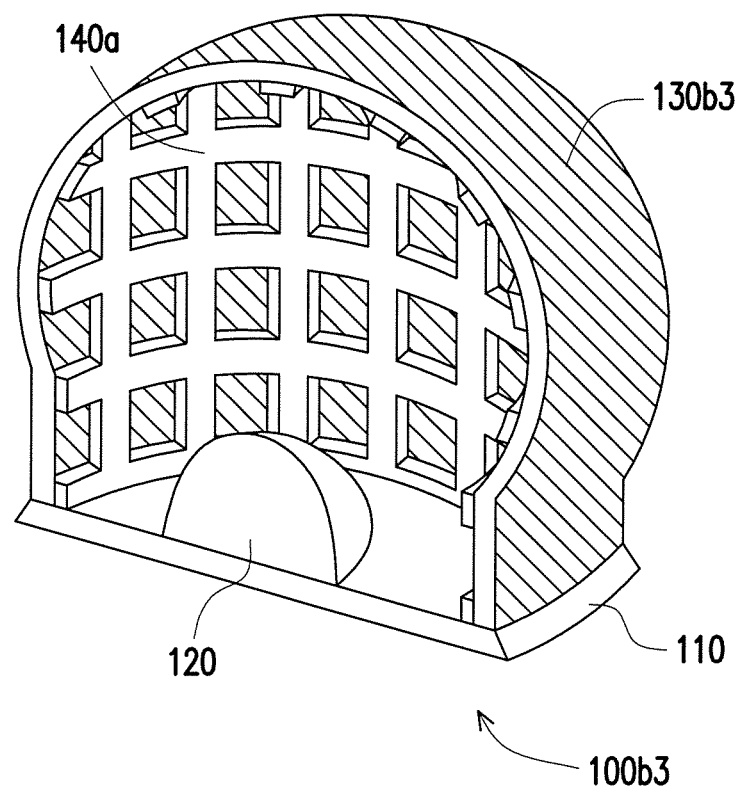
FIG. 3C is a partial three-dimensional cross-sectional view of a light-emitting device according to yet another embodiment of the invention.

The embodiment nevertheless does not limit the shape of the wavelength transferring cover 130a'. In fact, in addition to the bullet shape containing the arc top-cover 131a and the side-wall 133a as shown in FIG. 2, the wavelength transferring cover can be, for example, as the semi-sphere shape like the wavelength transferring cover 130b1 in the light-emitting device 100b1 of FIG. 3A, or the sphere shape like the wavelength transferring cover 130b2 in the light-emitting device 100b2 of FIG. 3B, or the roughly sphere shape with a narrow neck portion like the wavelength transferring cover 130b3 in the light-emitting device 100b3 of FIG. 3C, which the invention is not limited to and can be decided according to the real demand.

Figure 4:
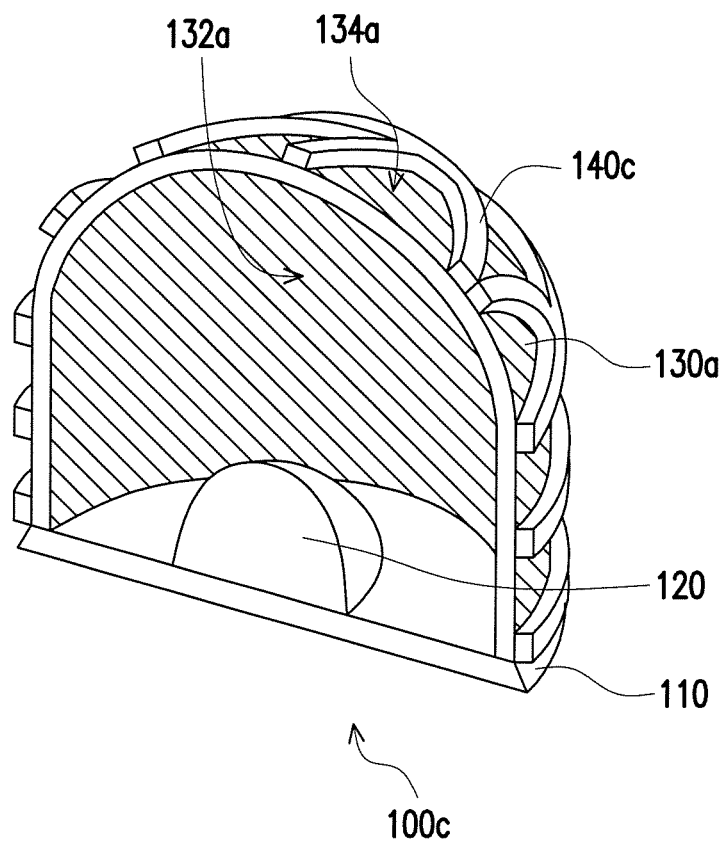
FIG. 4 is a partial three-dimensional cross-sectional view of a light-emitting device according to yet another embodiment of the invention.

The heat-conducting structure 140c of the light-emitting device 100c can be also, as shown by FIG. 4, for example, a mesh heat-conducting structure, which has a mesh pattern of quasi triangle shape and is disposed on the outer surface 134a of the wavelength transferring cover 130a, in which the mesh pattern of triangle shape can effectively reduce light-shading. The heat-conducting structure 140a herein occupies 5-40% of the surface area of the outer surface 134a of the wavelength transferring cover 130a; or in other unshown embodiments, the heat-conducting structure can be disposed both on the inner surface and the outer surface of the wavelength transferring cover.

Figure 5:
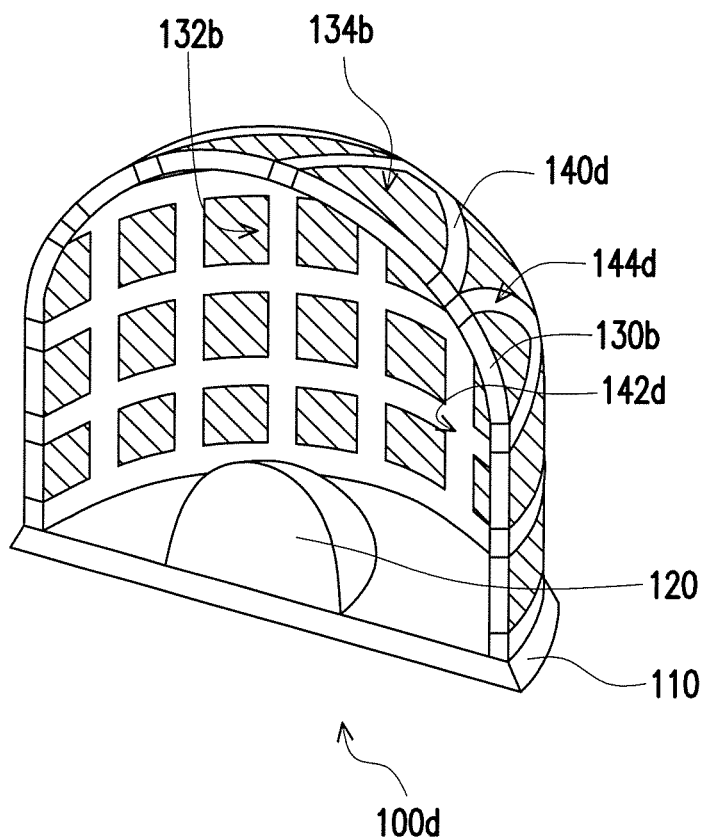
FIG. 5 is a partial three-dimensional cross-sectional view of a light-emitting device according to yet another embodiment of the invention.

The heat-conducting structure 140d of the light-emitting device 100d can be also, as shown by FIG. 5, for example, a mesh heat-conducting structure, which has a second inner surface 142d and a second outer surface 144d opposite to each other. The wavelength transferring cover 130b has a first inner surface 132b and a first outer surface 134b opposite to each other. In particular, the second inner surface 142d and the second outer surface 144d of the heat-conducting structure 140d are substantially coplanar respectively with the first inner surface 132b and the first outer surface 134 of the wavelength transferring cover 130b, i.e., the heat-conducting structure 140d and the wavelength transferring cover 130b are embedded with each other. In this way, in addition to directly deliver the heat produced by the light-emitting element 120 to outside, the heat can also quickly expelled by the heat-conducting structure 140d via the base 110 to avoid the heat from concentrating or staying on the wavelength transferring cover 130b.

The invention certainly does not limit the structure design of the heat-conducting structures 140a, 140b, 140c and 140d, although the heat-conducting structures 140a, 140b, 140c and 140d herein are embodied with a mesh heat-conducting structure already and have a larger heat-dissipating surface area. However in other unshown embodiments, the heat-conducting structure can be also a sheet heat-conducting structure, a tube heat-conducting structure or a heat-conducting structure composed of a polygonal sheet body (for example, a pentagonal or hexagonal sheet body), which still belongs to the technical scheme of the invention without departing the protection scope of the invention.

Figure 6:
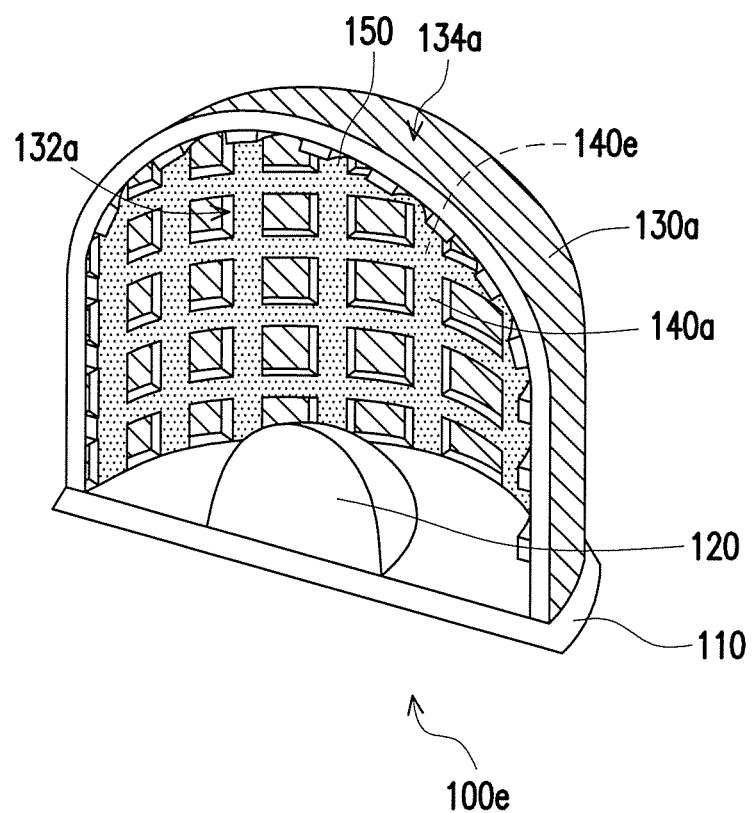
FIG. 6 is a partial three-dimensional cross-sectional view of a light-emitting device according to yet another embodiment of the invention.

In order to further advance the light emitting effect of the light-emitting element 120, referring to FIG. 6, a light-emitting device 100e of the embodiment can further include a reflective material layer 150 disposed on the heat-conducting structure 140a. The material of the reflective material layer 150 is, for example, selected from at least one of silver, chromium, nickel and aluminium, or the reflective material layer 150 is a distributed Bragg reflector (DBR).

In summary, since the heat-conducting structure of the invention is disposed on the base and directly contacts the wavelength transferring cover, the heat-conducting structure can quickly expel the heat produced by the light-emitting element and avoid the heat produced by the light-emitting element from concentrating on the wavelength transferring cover so as to effectively reduce the thermal quenching phenomenon of luminescence of the wavelength transferring cover. In short, the light-emitting device of the invention has better heat-dissipating effect and can effectively avoid producing the thermal quenching phenomenon of luminescence.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A light-emitting device, comprising:
   a base;
   a wavelength converting structure, comprising:
      a heat-conducting structure comprising a plurality of accommodating spaces; and
      a wavelength converting material filled in the accommodating spaces; and
   at least one light-emitting element disposed on the base, wherein the base is connected to the heat-conducting structure, and the wavelength converting structure covers the light-emitting element.

2. The light-emitting device as claimed in claim 1, wherein material of the heat-conducting structure is selected from the group consisting of silver, gold, copper, platinum, tin, aluminium, carbon nanotube, graphene and combinations thereof.

3. The light-emitting device as claimed in claim 1 further comprising:
   a heat-dissipating base, wherein the base is disposed on the heat-dissipating base.

4. The light-emitting device as claimed in claim 3, wherein material of the heat-dissipating base is selected from the group consisting of aluminium, tin, copper, silver, gold, ceramic and combinations thereof.

5. The light-emitting device as claimed in claim 1 further comprising:
   a reflective material layer, disposed on the heat-conducting structure.

6. The light-emitting device as claimed in claim 5, wherein material of the reflective material layer is selected from the group consisting of silver, chromium, nickel, aluminium and combinations thereof.

7. The light-emitting device as claimed in claim 5, wherein the reflective material layer is a distributed Bragg reflector (DBR).

8. The light-emitting device as claimed in claim 1, wherein the wavelength converting material occupies 60%-95% of the surface of the wavelength converting structure.

9. A light-emitting device, comprising:
   a base having at least one light-emitting element mounted thereon;
   a heat-conducting meshed frame connected to the base; and
   a plurality of wavelength converting blocks embedded in meshes of the heat-conducting meshed frame, the wavelength converting blocks and the heat-conducting meshed frame covering the light-emitting element.

10. The light-emitting device as claimed in claim 9, wherein material of the heat-conducting meshed frame is selected from the group consisting of silver, gold, copper, platinum, tin, aluminium, carbon nanotube, graphene and combinations thereof.

11. The light-emitting device as claimed in claim 9 further comprising:
   a heat-dissipating base, wherein the base is disposed on the heat-dissipating base.

12. The light-emitting device as claimed in claim 11, wherein material of the heat-dissipating base is selected from the group consisting of aluminium, tin, copper, silver, gold, ceramic and combinations thereof.

13. The light-emitting device as claimed in claim 9 further comprising:
   a reflective material layer, disposed on the heat-conducting meshed frame.

14. The light-emitting device as claimed in claim 13, wherein material of the reflective material layer is selected from the group consisting of silver, chromium, nickel, aluminium and combinations thereof.

15. The light-emitting device as claimed in claim 13, wherein the reflective material layer is a DBR.

16. A light-emitting device, comprising:
   a base having at least one light-emitting element mounted thereon;
   a wavelength converting layer; and
   a light-transmissive and heat-conducting body connected to the base, wherein the wavelength converting layer is carried and covered by the heat-conducting body, and the wavelength converting layer and the heat-conducting body cover the light-emitting element.

17. The light-emitting device as claimed in claim 16, wherein material of the heat-conducting body is selected from the group consisting of silver, gold, copper, platinum, tin, aluminium, carbon nanotube, graphene and combinations thereof.

18. The light-emitting device as claimed in claim 16 further comprising:
a heat-dissipating base, wherein the base is disposed on the heat-dissipating base.

19. The light-emitting device as claimed in claim 18, wherein material of the heat-dissipating base is selected from the group consisting of aluminium, tin, copper, silver, gold, ceramic and combinations thereof.

20. The light-emitting device as claimed in claim 16 further comprising:
a reflective material layer, disposed on the heat-conducting body.

21. The light-emitting device as claimed in claim 20, wherein material of the reflective material layer is selected from the group consisting of silver, chromium, nickel, aluminium and combinations thereof.

22. The light-emitting device as claimed in claim 20, wherein the reflective material layer is a distributed Bragg reflector (DBR).

23. A light-emitting device, comprising:
a light emitting base;
a wavelength converting material covering the light emitting base; and
a reflective and heat-conducting body connecting the light emitting base and the wavelength converting material, and the reflective and heat-conducting body being light-transmissive.

24. The light-emitting device as claimed in claim 23, wherein the light emitting base comprises:
a base; and
at least one light-emitting element disposed on the base, wherein the base is connected to the carrier, and the wavelength converting material and the carrier cover the light-emitting element.

25. The light-emitting device as claimed in claim 23, wherein material of the carrier is selected from the group consisting of silver, gold, copper, platinum, aluminium, carbon nanotube, graphene and combinations thereof.

26. The light-emitting device as claimed in claim 23 further comprising:
a heat-dissipating base, wherein the light emitting base is disposed on the heat-dissipating base.

27. The light-emitting device as claimed in claim 26, wherein material of the heat-dissipating base is selected from the group consisting of aluminium, tin, copper, silver, gold, ceramic and combinations thereof.

28. The light-emitting device as claimed in claim 23 further comprising:
a reflective material layer, disposed on the carrier.

29. The light-emitting device as claimed in claim 28, wherein material of the reflective material layer is selected from the group consisting of silver, chromium, nickel, aluminium and combinations thereof.

30. The light-emitting device as claimed in claim 28, wherein the reflective material layer is a DBR.

31. The light-emitting device as claimed in claim 23, wherein the carrier occupies 5-40% of the surface area of the wavelength converting cover.

* * * * *